(12) United States Patent
Hobbs et al.

(10) Patent No.: US 6,465,853 B1
(45) Date of Patent: Oct. 15, 2002

(54) METHOD FOR MAKING SEMICONDUCTOR DEVICE

(75) Inventors: Christopher C. Hobbs; Baohong Cheng, both of Austin; Lurae G. Dip, Cedar Creek, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/851,206

(22) Filed: May 8, 2001

(51) Int. Cl.⁷ .............................................. H01L 29/76
(52) U.S. Cl. ...................... 257/410; 257/412; 438/240
(58) Field of Search ................ 257/410, 412; 438/240, 183, 287; 435/7.32; 437/42; 357/23.15; 436/518

(56) References Cited

U.S. PATENT DOCUMENTS

| | | | |
|---|---|---|---|
| 5,134,451 A | * 7/1992 | Katoh | 357/23.15 |
| 5,292,673 A | * 3/1994 | Shinriki et al. | 437/42 |
| 5,639,671 A | * 6/1997 | Bogart et al. | 436/518 |
| 6,210,999 B1 | * 4/2001 | Gardner et al. | 438/183 |
| 6,235,594 B1 | * 5/2001 | Merchant et al. | 438/287 |
| 6,294,820 B1 | * 9/2001 | Lucas et al. | 257/412 |

* cited by examiner

*Primary Examiner*—Hoai Ho
*Assistant Examiner*—Thinh Nguyen
(74) *Attorney, Agent, or Firm*—James L. Clingan, Jr.; Kim-Marie Vo

(57) ABSTRACT

A zirconium oxide gate dielectric is utilized to make a transistor for an integrated circuit. In forming the transistor which uses the zirconium oxide as the gate dielectric, the zirconium oxide is etched using phosphoric acid. This phosphoric acid is a wet etch performed at an elevated temperature to achieve a simultaneous etch of a silicon nitride anti-reflective coating which overlies the gate. This use of phosphoric acid is effective because the etch is stopped by silicon oxide so that the underlying silicon substrate is protected. Also, the field oxide is not etched in any appreciable amount. Thus, the field oxide thickness is unchanged as a result of the etch.

14 Claims, 2 Drawing Sheets

METHOD FOR MAKING SEMICONDUCTOR DEVICE

FIELD OF THE INVENTION

The invention relates to a method for making a semiconductor device and more particularly to making a semiconductor device using a metal oxide.

RELATED ART

One area of interest in the semiconductor technology is the development of high-K dielectrics for use as a gate dielectric. This is important due to the limitations encountered as the conventional gate dielectric material is scaled to improve performance. Silicon dioxide has been the preferred choice for gate dielectric because of its good electrical properties and compatibility with the conventional materials. As the silicon dioxide thickness is scaled, and becomes very thin, the leakage current becomes high and results in unacceptably high power consumption. To reduce the power consumption, it is desirable to replace the silicon dioxide with a dielectric material that is physically thicker but that has a higher dielectric constant to achieve the same effective silicon dioxide thickness.

Metal oxides are such high K materials that are being studied for this purpose. In a conventional CMOS process flow, it is important to be able to selectively remove the metal oxide from the source/drain regions. One of the difficulties with metal oxides, including zirconium oxide, is that they etch differently than many of the conventional materials commonly used in the semiconductor industry. For example, hydrofluoric acid (HF) is the conventional etch for silicon dioxide but has not proven to be effective for removing some metal oxide materials. Often some of the metal oxide is not completely removed, and the selectivity to silicon oxide is poor. A long HF etch time will remove substantial amounts of the field oxide and is very undesirable. Furthermore, some of the commonly used chemistries such as hydrochloric acid (HCl), SC1 ($NH_4OH:H_2O_2:H_2O$), sulfuric acid ($H_2SO_4$), and piranha ($H_2SO_4:H_2O_2$) were found to be ineffective for etching zirconium oxide.

Another concern in removing a metal oxide is that the underlying silicon in the active regions must remain relatively smooth. An issue with chemicals sometimes used for metal oxide etching is preferential etching along grain boundaries. This forms openings in the metal oxide and results in etching through the interfacial oxide that exists in the area immediately above and adjacent to the substrate. The problem is that the etchant disrupts and makes the surface of the exposed underlying silicon rough. A rough silicon surface is very undesirable. It increases the source drain resistance and affects the source drain junction depths. It is important that the source/drain junction depths be consistent from one transistor to another. Thus, there is a need for a metal oxide etch that does not cause excessive roughness of the silicon and does not take an excessive amount of time in order to etch the metal oxide.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Hot phosphoric acid is used to etch zirconium oxide in order to achieve a desirable etch characteristic. This etch results in the zirconium oxide being removed before the interfacial oxide is removed. Thus, the interfacial oxide acts as an etch stop and protects the silicon in the substrate from being etched. This preserves the smoothness of the substrate. This etch is effective also in completely removing as-deposited or densified zirconium oxide. Due to its selectivity to oxide, the field oxide regions are not adversely etched during the zirconium oxide etch process.

Figure 1:
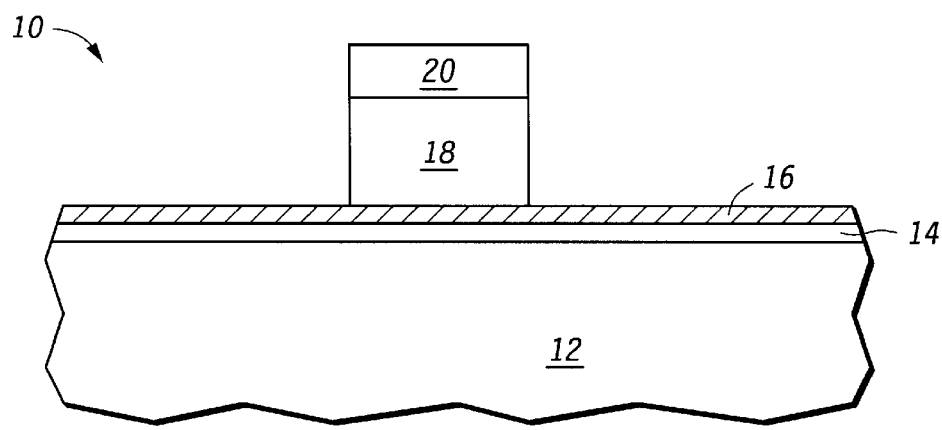
FIG. 1 is a cross section of a semiconductor device according to the prior art at a beginning stage in processing.

Shown in FIG. 1 is a device structure 10 comprising a semiconductor substrate 12, an interfacial oxide 14, a zirconium oxide layer 16, a polysilicon gate 18 and an anti-reflective coating (ARC) 20. This structure is achieved using conventional techniques for obtaining a polysilicon gate overlying a semiconductor substrate having a high K dielectric. In this case, the high K dielectric is selected to be zirconium oxide. The silicon rich nitride ARC overlies the polysilicon gate, which is a conventional approach. Polysilicon gate has resulted from a conventional etch to form a gate patterned in the manner desired. Interfacial oxide 14 is a conventional oxide layer formed as a result of normal semiconductor processes. As an alternative this could be an oxynitride or doped with one or more of the following: Al, Hf, N, Ti, Ge, La, and Ta. Overlying interfacial oxide layer 14 is zirconium oxide layer 16. Overlying zirconium oxide layer 16 is polysilicon gate 18. It is not essential that interfacial oxide layer 14 be formed, but it commonly is as a result of standard processing. It may be advantageous to not have it if that is a possibility.

Figure 2:
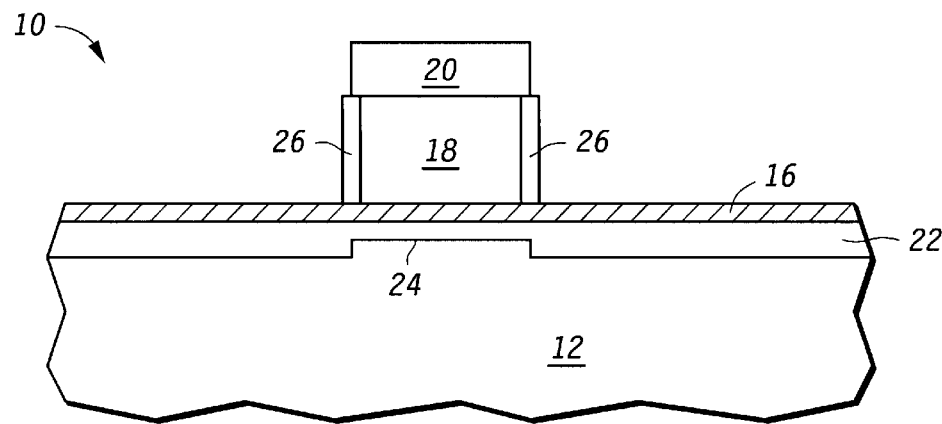
FIG. 2 is a cross section at a subsequent step to that of FIG. 1 and according to a preferred embodiment of the invention.

A gate sidewall oxide 26 is formed around polysilicon gate 18 as shown in FIG. 2. Coincident with the formation of gate sidewall oxide 26 is the formation of a thickened interfacial oxide 22. This leaves an interfacial gate oxide 24 immediately under polysilicon gate 18. Interfacial gate oxide 24 is thinner than the thickened interfacial oxide. This is a desirable result that interfacial gate oxide 24 would not increase in thickness over the originally formed interfacial layer 14. In an alternate embodiment, the gate etch process may be used to form oxides 22 and 26.

Figure 3:
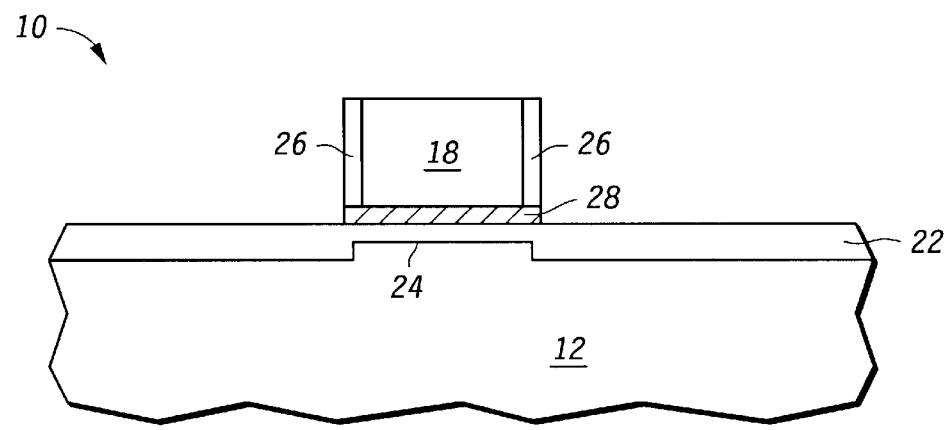
FIG. 3 is a cross section of the semiconductor device at a subsequent step to that shown in FIG. 2.
Figure 4:
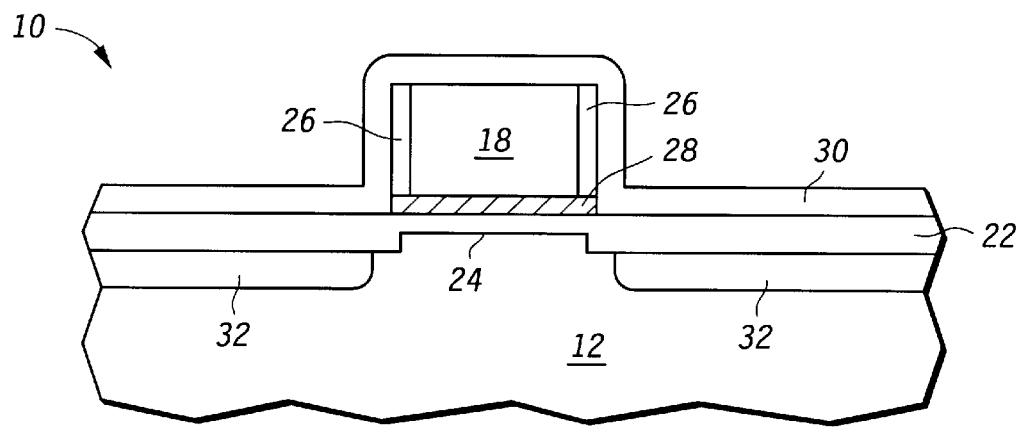
FIG. 4 is a cross section of the semiconductor at a subsequent step to that shown in FIG. 3.

Polysilicon gate 18 is prepared for a subsequent etch of zirconium oxide layer 16 by the use of this gate sidewall oxide 26. A hot phosphoric etch is performed to cause the result in the structure shown in FIG. 3. This shows the removal of zirconium oxide layer 16 that is not covered by polysilicon gate 18 and gate sidewall oxide 26. The remaining portion of zirconium layer 16, which is under polysilicon gate 18, is shown as region 28 in FIG. 3. The silicon rich nitride ARC 20 has also been removed by the hot phosphoric etch. Hot phosphoric acid is known to etch silicon oxide at a very slow rate. However, the silicon oxide of thickened interfacial oxide 22 and gate sidewall oxide 26 are not etched in a significant amount by the hot phosphoric acid. As seen in FIG. 3, thickened interfacial oxide 22 remains so that substrate 12 is protected from the hot phosphoric acid. Thus, the surface of substrate 12, which in this case is the interface between substrate 12 and thickened interfacial oxide 22, is not roughened by the hot phosphoric acid. Because silicon oxide is not significantly etched by hot phosphoric acid, the field oxide is not reduced in thickness. Field oxide is not shown in the figures but is commonly known as the insulating material used to isolate adjacent devices. Trench isolation is an example of a typical field oxide. In order to complete a transistor, it is desirable to put an oxide liner 30, as shown in FIG. 4, on the sidewall of the polysilicon gate to act as a mask for the subsequent implant of the source/drain extension 32. This is for the source/drain implants and, potentially, halo implants. By having oxide liner 30, the implants do not penetrate through zirconium oxide gate dielectric 28. This prevents damage and/or contamination of the zirconium oxide, particularly at the edge, which is where leakage is most likely to occur and the reliability of zirconium is more likely to degrade. There is an advantage of not having the liner if the implant at the corner of the gate does not damage the gate or does not drive zirconium into the substrate. The liner absorbs much of the implant dose and results in a less abrupt junction. Thus, if the liner can be avoided, then the result is more abrupt junctions, which is desirable.

After oxide liner 30 has been formed as shown in FIG. 4, an implant is performed which forms source/drain extension 32. It is this implant that is prevented from penetrating through zirconium oxide gate dielectric 28 by virtue of the use of oxide liner 30 and further completes the formation of a transistor.

Figure 5:
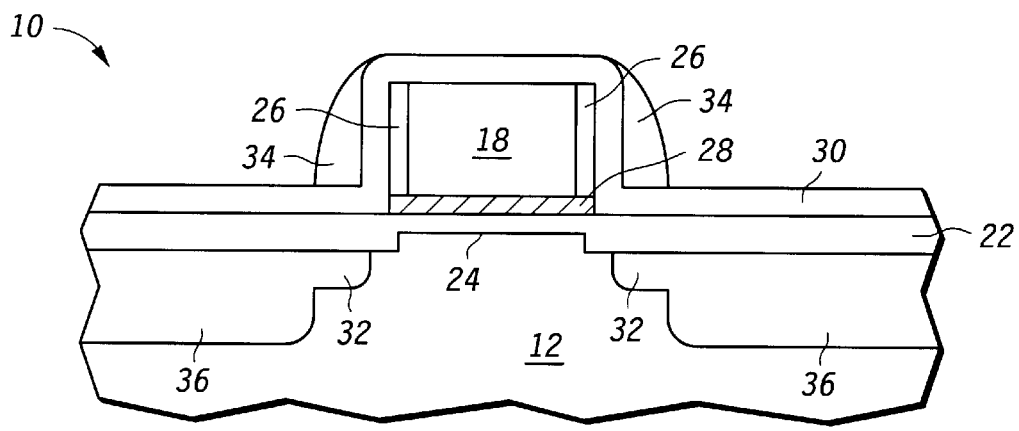
FIG. 5 is a cross section of the semiconductor device at a subsequent step to that shown in FIG. 4.
Figure 6:
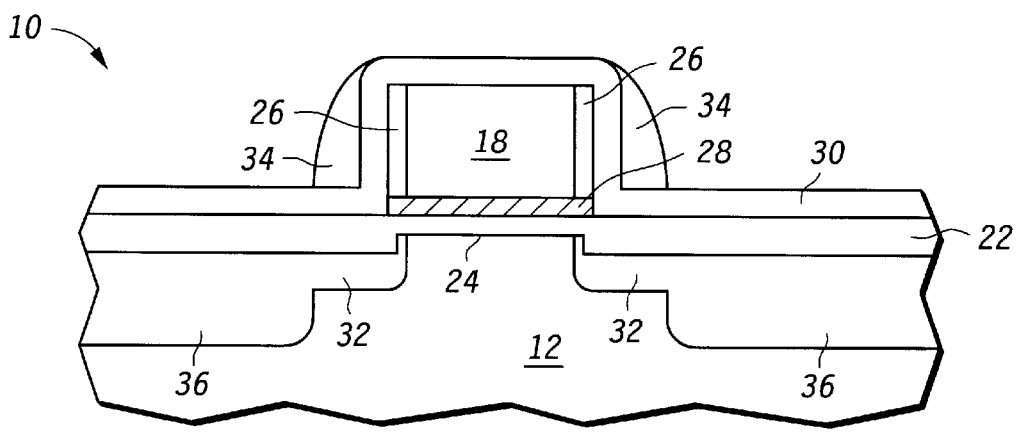
FIG. 6 is a cross section of the semiconductor device at a subsequent step to that shown in FIG. 5.

A sidewall spacer 34, as shown in FIG. 5, is formed by conventional means along the sidewall of polysilicon gate 18. This sidewall spacer may be silicon nitride, which is a common choice for a sidewall spacer for making a transistor. After sidewall spacer 34 has been formed, an implant is performed which results in deep source/drain 36 as shown in FIG. 5. The second implant, which forms deep source/drain 36, is a significantly heavier dose and higher energy than that which forms source/drain extension 32. Thus, deep source/drain 36 is deeper than source/drain extension 32. This is formed by conventional techniques.

A subsequent anneal occurs to activate and diffuse the implants so that source drain extension 32 extends under polysilicon gate 18. This overlap is desirable to reduce the source/drain parasitic resistance.

Thus, a technique is described for etching zirconium oxide and achieving the desired results of leaving the interfacial gate oxide intact which protects the underlying semiconductor surface and also not removing any significant amount of the field oxide. In fact, there is minimal removal of the field oxide because phosphoric acid acts quickly enough to remove all of the zirconium oxide before much etching of silicon oxide. Thus, hot phosphoric acid is characterized by a temperature that is 153 degrees Celsius. There is existing equipment that provides this wet bath and maintains the temperature at 153 degrees. The thickness of the zirconium oxide layer 16 was selected to be 30–50 angstroms. The time of the etch is between 10–30 minutes (Depending on the thickness, we may be able to shorten the time to 5 min). The shorter time is desirable for throughput. The longer time is desirable to ensure that there is no zirconium oxide left.

The temperature of 153 degrees Celsius was chosen because that is a well-known temperature for etching silicon nitride. The etch of the ARC, which is silicon-rich silicon nitride, is thus advantageously achieved at the same time as the zirconium oxide. Thus, ARC 20 and the zirconium oxide, although different materials are removed in a single processing step. Phosphoric acid at a lower temperature, even room temperature, as distinct from the approximately 153 degrees Celsius specifically used may be effective for the purpose of removing the zirconium oxide. Higher temperatures may also be effective in removing zirconium oxide. Hot phosphoric acid is considered to be greater than 100 degrees Celsius. There may be a higher temperature for effective use of the phosphoric acid while avoiding excessive gas formation and other difficulties in handling. A temperature of 200 degrees Celsius may be effective in this regard.

Phosphoric acid has thus been determined to be effective in etching zirconium oxide. Phosphoric acid, however, does not affect all metal oxides in the same way. For example, hafnium oxide is poorly etched by phosphoric acid. Other metal oxides may be effectively etched by phosphoric acid if they are zirconium-doped. Or conversely, if zirconium oxide were doped by another metal, phosphoric acid should still be effective. Thus, zirconium oxide layer 16 may be substituted by a metal oxide layer that is zirconium doped or by zirconium oxide that has been doped by another material. Other materials that may be doped by zirconium include at least Al, Hf, Si, N, Ti, Ge, La, and Ta.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device, comprising:

providing a semiconductor substrate;

forming a gate dielectric layer over the semiconductor substrate, wherein the gate dielectric layer comprises zirconium and oxygen;

forming a gate over a first portion of the gate dielectric layer; and removing a second portion of the gate dielectric layer using phosphoric acid.

2. The method of claim 1, wherein the gate dielectric layer is further characterized as zirconium dioxide.

3. The method of claim 1, wherein removing the second portion of the gate dielectric layer is performed at a temperature of approximately 100 degrees Celsius to approximately 200 degrees Celsius.

4. The method of claim 3, wherein removing the second portion of the gate dielectric layer is performed at a temperature of approximately 150 degrees Celsius.

5. The method of claim 1, wherein the gate dielectric layer further comprises an element selected from the group consisting of: Al, Hf, Si, N, Ti, Ge, La, and Ta.

6. The method of claim 5, wherein the gate dielectric layer further comprises at least one additional element selected from the group consisting of: Al, Hf, Si, N, Ti, Ge, La and Ta.

7. The method of claim 1, wherein the first portion of the gate dielectric layer is adjacent to the second portion of the gate dielectric layer.

8. A method of forming a semiconductor device, comprising:

providing a semiconductor substrate;

forming a first gate dielectric layer over the semiconductor substrate;

forming a gate layer over the first gate dielectric layer;

forming an antireflective coating (ARC) layer over the gate layer;

forming a gate electrode over a first portion of the first gate dielectric layer by removing the ARC layer and gate layer over a second portion of the first gate dielectric layer;

forming an oxide layer along the sidewalls of the gate; and removing a second portion of the first gate dielectric layer.

9. The method of claim 8, further comprising thickening the first gate dielectric in the second portion of the first gate dielectric layer.

10. The method of claim 9, further comprising:

forming an oxide liner over the gate, the oxide layer along the sidewalls of the gate and portion of the semiconductor substrate, after removing a second portion of the first gate dielectric.

11. The method of claim 8, further comprising implanting a dopant into the semiconductor substrate after forming the oxide liner.

12. The method of claim 11, further comprising forming a spacer over the oxide liner.

13. The method of claim 8, wherein removing the second portion of the gate dielectric layer is performed at a temperature greater than room temperature.

14. The method of claim 13, wherein removing the second portion of the gate dielectric layer is performed at a temperature of approximately 150 degrees Celsius.

* * * * *